United States Patent
Wu

(10) Patent No.: US 10,672,797 B2
(45) Date of Patent: Jun. 2, 2020

(54) ARRAY SUBSTRATE, METHOD FOR FABRICATING ARRAY SUBSTRATE AND DISPLAY

(71) Applicants: CHONGQING HKC OPTOELECTRONICS TECHNOLOGY CO., LTD., Chongqing (CN); HKC CORPORATION LIMITED, Shenzhen, Guangdong (CN)

(72) Inventor: Chuan Wu, Chongqing (CN)

(73) Assignees: CHONGQING HKC OPTOELECTRONICS TECHNOLOGY CO., LTD., Chongqing (CN); HKC CORPORATION LIMITED, Shenzhen, Guangdong (CN)

( * ) Notice: Subject to any disclaimer, the term of this patent is extended or adjusted under 35 U.S.C. 154(b) by 0 days.

(21) Appl. No.: 16/313,224

(22) PCT Filed: Nov. 1, 2018

(86) PCT No.: PCT/CN2018/113389
§ 371 (c)(1),
(2) Date: Dec. 26, 2018

(65) Prior Publication Data
US 2020/0105796 A1    Apr. 2, 2020

(30) Foreign Application Priority Data

Sep. 30, 2018   (CN) .......................... 2018 1 1157289

(51) Int. Cl.
*H01L 27/12*    (2006.01)
*H01L 29/786*   (2006.01)
*G02F 1/1368*   (2006.01)
*H01L 29/66*    (2006.01)
*H01L 27/32*    (2006.01)

(52) U.S. Cl.
CPC ........ *H01L 27/1218* (2013.01); *G02F 1/1368* (2013.01); *H01L 27/127* (2013.01); *H01L 27/1222* (2013.01); *H01L 27/1229* (2013.01); *H01L 27/1274* (2013.01); *H01L 27/3262* (2013.01); *H01L 29/66765* (2013.01); *H01L 29/78669* (2013.01)

(58) Field of Classification Search
CPC ..................... H01L 29/66007; H01L 29/7866
See application file for complete search history.

(56) References Cited

U.S. PATENT DOCUMENTS

| 2013/0087783 | A1* | 4/2013 | Wang | H01L 21/316 257/43 |
| 2017/0162709 | A1* | 6/2017 | Nodera | G02F 1/136277 |
| 2017/0236948 | A1* | 8/2017 | Mizumura | H01L 21/20 257/66 |
| 2018/0358473 | A1* | 12/2018 | Bai | H01L 27/1229 |
| 2019/0088788 | A1* | 3/2019 | Ban | H01L 29/78618 |

* cited by examiner

*Primary Examiner* — Cheung Lee
(74) *Attorney, Agent, or Firm* — Law Offices of Albert Wai-Kit Chan, PLLC

(57) ABSTRACT

The array substrate includes: a substrate; a gate electrode; a gate insulating layer; an active layer; a source-drain electrode; a passivation layer; a pixel electrode; the active layer includes a first silicon layer, and the first silicon layer disposed below the channel is composed of polycrystalline silicon, and the remaining part of the first silicon layer is composed of amorphous silicon.

11 Claims, 2 Drawing Sheets

ARRAY SUBSTRATE, METHOD FOR FABRICATING ARRAY SUBSTRATE AND DISPLAY

CROSS-REFERENCE TO RELATED APPLICATIONS

This application is the International Application No. PCT/CN2018/113389 for entry into US national phase with an international filing date of Nov. 1, 2018, designating US, now pending, and claims priority to Chinese Patent Application No. 201811157289.2, filed on Sep. 30, 2018, the content of which is incorporated herein by reference in its entirety.

BACKGROUND OF THE INVENTION

Field of the Invention

The present application pertains to the technical field of display, and particularly relates to an array substrate, a method for fabricating an array substrate, and a display.

Description of Related Art

The LCD (Liquid Crystal Display) is a liquid crystal display, its structure is to dispose a liquid crystal cell between two parallel glass substrates, in which a thin film transistor (TFT) is disposed on the lower substrate glass, and a color filter is disposed on the upper substrate glass. The direction of rotation of the liquid crystal molecules is controlled by the signal and voltage changes on the TFT, so as to control the emission of polarized light at each pixel point for display purposes. The LCD has a defect of insufficient transmittance. The OLED (Organic Light-Emitting Diode) is an organic light-emitting diode, also known as the organic electroluminescent display, which is a different type of product compared with the TFT LCD, and has the advantages such as self-luminous, wide viewing angle, high contrast, low power consumption, high reaction rate, full color and simple process and the like, but there is a shortage of service life.

The Micro LED (Micro Light Emitting Diode) is a micro light emitting diode, which, compared with the LCD and the OLED, solves the problems of insufficient transmittance of the LCD and service life of the OLED. The Micro LED is to thin, miniaturize and array the design of the LED structure, the size of the Micro LED may be about 1~10 μm, and then the Micro LED is transferred to the circuit board in batches, and next the protective layer and the upper electrodes are completed by a physical deposition process, and then the package of the upper substrate may be implemented, thus achieving one Micro LED display.

The conventional a-Si (amorphous silicon) has an electron mobility of only about 0.5 $cm^2/Vs$, which is insufficient to provide a large on-state current for current driving. The LTPS (Low Temperature Polycrystalline Silicon) has an electron mobility of up to 100 $cm^2/Vs$, but the complex structure and film uniformity of the TFT devices limit its application in generation panels.

BRIEF SUMMARY OF THE INVENTION

The purpose of the present application is to overcome the above-mentioned deficiencies in the prior art, and to provide an array substrate, a fabrication method thereof and a display, which are intended to include, but are not limited to solve the technical problem that the existing amorphous silicon and polycrystalline silicon are difficult to be simultaneously applied to the Micro LED.

In order to achieve above purpose, the present application adopts the following technical solutions:

An array substrate, including:
a substrate;
a gate electrode formed on the substrate;
a gate insulating layer formed on the substrate and covering the gate electrode;
an active layer formed on the gate insulating layer;
a source-drain electrode formed on the gate insulating layer and covering the active layer, wherein the source-drain electrode is provided with a channel, and the channel is disposed above the active layer;
a passivation layer formed on the source-drain electrode; and
a pixel electrode formed on the passivation layer;
wherein, the active layer includes a first silicon layer formed on the gate insulating layer, and the first silicon layer disposed below the channel is composed of polycrystalline silicon, and the remaining part of the first silicon layer is composed of amorphous silicon.

In an embodiment, the active layer further includes a second silicon layer composed of an amorphous silicon material, and the second silicon layer is formed on the first silicon layer.

In an embodiment, the active layer further includes a third silicon layer composed of a doped amorphous silicon material, and the third silicon layer is formed on the second silicon layer.

In an embodiment, the array substrate further includes an etching barrier layer formed on the first silicon layer composed of polycrystalline silicon.

A method for fabricating an array substrate, including the following steps of: providing a substrate;
preparing a gate electrode on the substrate;
preparing a gate insulating layer on the gate electrode;
preparing a first silicon layer on the gate insulating layer;
preparing a source-drain electrode on the first silicon layer, wherein the source-drain electrode is provided with a channel;
preparing a passivation layer on the source-drain electrode; and
preparing a pixel electrode on the passivation layer;
wherein, the first silicon layer forms the active layer, and the first silicon layer disposed below the channel is composed of polycrystalline silicon, and the remaining part of the first silicon layer is composed of amorphous silicon.

In an embodiment, the step of preparing a first silicon layer on the gate insulating layer includes:
depositing an amorphous silicon material layer on the gate insulating layer; and
covering a laser mask on the amorphous silicon material layer, and performing laser annealing by a laser beam, such that the exposed amorphous silicon under the channel is converted into polycrystalline silicon so as to obtain the first silicon layer.

In an embodiment, the annealing energy for the laser annealing treatment is 200-450 $mJ/cm^2$.

In an embodiment, the laser annealing is excimer laser annealing.

In an embodiment, the laser annealing is Yttrium aluminum garnet laser beam annealing.

In an embodiment, the method further comprises depositing an etching barrier layer under the channel.

A display, including an array substrate, and the array substrate includes:
  a substrate;
  a gate electrode formed on the substrate;
  a gate insulating layer formed on the substrate and covering the gate electrode;
  an active layer formed on the gate insulating layer;
  a source-drain electrode formed on the gate insulating layer and covering the active layer, wherein the source-drain electrode is provided with a channel, and the channel is disposed above the active layer;
  a passivation layer formed on the source-drain electrode; and
  a pixel electrode formed on the passivation layer;
  wherein, the active layer includes a first silicon layer formed on the gate insulating layer, and the first silicon layer disposed below the channel is composed of polycrystalline silicon, and the remaining part of the first silicon layer is composed of amorphous silicon; the active layer further includes a second silicon layer composed of an amorphous silicon material and formed on the first silicon layer, and a third silicon layer composed of a doped amorphous silicon material and formed on the second silicon layer; and
  an etching barrier layer formed on the first silicon layer composed of polycrystalline silicon.

In an embodiment, the display is a Micro LCD display.

In the array substrate provided by the embodiment of the present application, the active layer is composed of the unique first silicon layer, and the first silicon layer is composed of the polycrystalline silicon and amorphous silicon, such array substrate has both a conventional amorphous silicon TFT structure and a high electron mobility characteristic of polycrystalline silicon. Therefore, the overall electron mobility of the active layer of the array substrate is higher than the electron mobility of the array substrate in the prior art, thus the array substrate has the potential to be used in large generation lines.

The method for fabricating the array substrate provided in the embodiment of the present application, fabricates the first silicon layer composed of both the polycrystalline silicon and the amorphous silicon as the active layer. This fabrication method has both advantages of simple processes of the conventional a-Si and the high mobility of the polycrystalline silicon, which has strong operability in large generation lines, and the overall electron mobility of the active layer of the array substrate finally fabricated is higher than the electron mobility of the current active layer.

The display of the embodiment of the present application includes the array substrate unique in the present application, and in the array substrate, the first silicon layer composed of polycrystalline silicon and amorphous silicon, the second silicon layer composed of the amorphous silicon material and the third silicon layer composed of the doped amorphous silicon material serve as the active layer, which has both a conventional TFT structure of the amorphous silicon and a high electron mobility characteristic of the polycrystalline silicon. Such a display has a better light-emitting effect.

BRIEF DESCRIPTION OF THE DRAWINGS

In order to more clearly illustrate the technical solutions in the embodiments of the present application, the drawings used in the description of the embodiments or the prior art will be briefly described below. Obviously, the drawings in the following description are merely some embodiments of the present application, and other drawings may be obtained based on these drawings for those ordinaries skilled in the art without inventive work.

Figure 1:
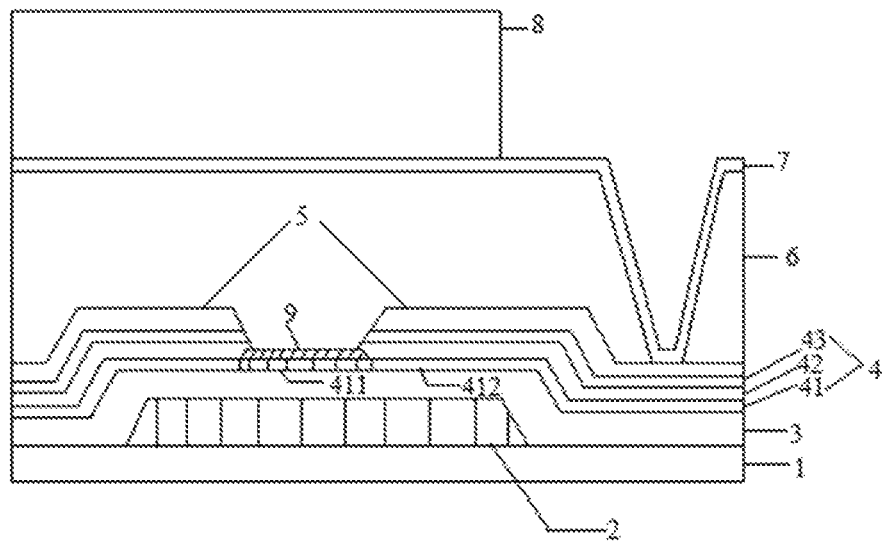
FIG. 1 is a structural schematic view of the Micro LED display fabricated by an embodiment of the present application.

Herein, the reference signs in the drawings are as follows:
  1-substrate; 2-gate electrode; 3-gate insulating layer; 4-active layer; 41-first silicon layer; 42-second silicon layer; 43-third silicon layer; 411-polycrystalline silicon; 412-amorphous silicon; 5-source-drain electrode; 6-passivation layer; 7-pixel electrode; 8-Micro LED; 9-etching barrier layer.

DESCRIPTION OF THE EMBODIMENTS

In order to make the technical problems, technical solutions and advantages of the present application more clear, the present application will be further described in detail below with reference to the accompanying drawings and embodiments. It should be understood that, the specific embodiments described herein are merely illustrative of the application and are not intended to limit the application.

It should be noted that, when an element is referred to as being "fixed" or "disposed" to another element, the element may be directly on another element or indirectly on another element. When an element is referred to as being "connected" to another element, the element may be directly connected to another element or indirectly connected to another element.

It should be understood that, the orientation and position relationship indicated by the terms "length", "width", "upper", "lower", "front", "back", "left", "right", "vertical", "horizontal", "top", "bottom", "inside", "outside" and the like are based on the orientation or position relationship as shown in the drawings, and are merely for convenience of description of the present application and simplifying description, and do not indicate or imply the indicated device or component must have a particular orientation, be constructed and operated in a particular orientation, and thus are not to be construed as limiting the present application.

Moreover, the terms "first" and "second" are used for descriptive purposes only and are not to be construed as indicating or implying a relative importance or implicitly indicating the amount of technical features indicated. Thus, the feature defined with "first" or "second" may include one or more of the features either explicitly or implicitly. In the description of the present application, "a plurality of" means two or more unless specifically defined otherwise.

Figure 2:
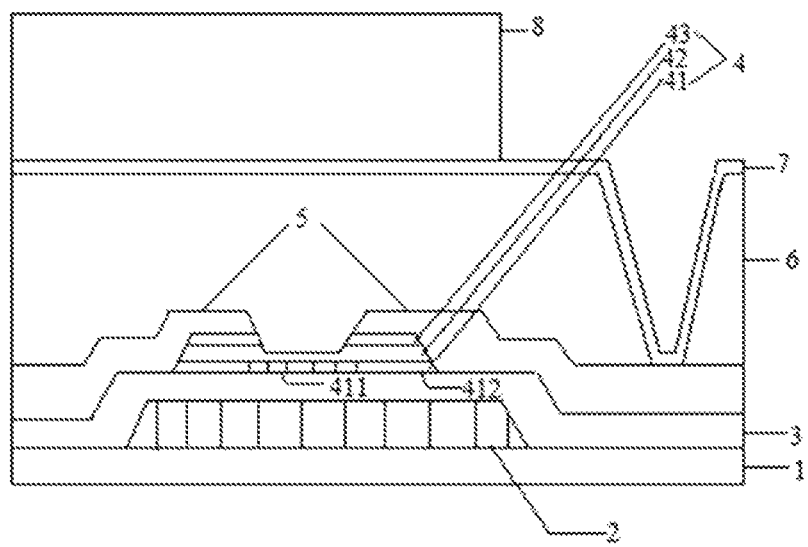
FIG. 2 is a structural schematic view of the Micro LED display fabricated by another embodiment of the present application.

In one aspect, an embodiment of the present application provides an array substrate, the structure of which is shown as FIG. 1 or FIG. 2, and the array substrate includes:
  a substrate 1;
  a gate electrode 2 formed on the substrate 1;
  a gate insulating layer 3 formed on the substrate 1 and covering the gate electrode 2;
  an active layer 4 formed on the gate insulating layer 3;

a source-drain electrode 5 formed on the gate insulating layer 3 and covering the active layer 4, wherein the source-drain electrode 5 is provided with a channel (not shown in the drawings), and the channel is disposed above the active layer 4;

a passivation layer 6 formed on the source-drain electrode 5; and a pixel electrode 7 formed on the passivation layer 6;

wherein, the active layer 4 includes a first silicon layer 41 formed on the gate insulating layer 3, and the first silicon layer 41 disposed below the channel is composed of polycrystalline silicon 411, and the remaining part of the first silicon layer 41 is composed of amorphous silicon 412.

In the array substrate provided by the embodiment of the present application, the active layer 4 is composed of the unique first silicon layer 41, and the first silicon layer 41 is composed of the polycrystalline silicon 411 (p-Si) and amorphous silicon 412 (a-Si), such array substrate has both a conventional amorphous silicon TFT structure and a high electron mobility characteristic of polycrystalline silicon. Therefore, the overall electron mobility of the active layer 4 of the array substrate is higher than the electron mobility of the array substrate in the prior art, thus the array substrate has the potential to be used in large generation lines.

It should be noted that, the first silicon layer 41 is composed of polycrystalline silicon (p-Si) and amorphous silicon (a-Si), that is to say, the first silicon layer 41 is as a whole, and the material in the middle is polycrystalline silicon, and the material on two sides of the polycrystalline silicon is amorphous silicon; and the position of the polycrystalline silicon portion is directly under the channel. During fabricating, the channel portion is exposed through a laser mask, such that the polycrystalline silicon material is obtained directly under the channel by laser annealing, thus "the first silicon layer 41 directly under the channel is composed of polycrystalline silicon 411", and the portion unexposed by the laser mask is not laser annealed and is still composed of amorphous silicon material. That is to say, the first silicon layer is made of polycrystalline silicon except for the portion, directly under the channel, which may be annealed by the laser, and the remaining portion is made of amorphous silicon material, therefore "the remaining portion of the first silicon layer 41 is composed of amorphous silicon 412".

Further, in the array substrate provided by an embodiment of the present application, the active layer 4 further includes a second silicon layer 42 composed of an amorphous silicon material, and the second silicon layer 42 is formed on the first silicon layer 41. Specifically, the second silicon layer 42 is formed on a surface of the first silicon layer 41 facing away from the gate insulating layer 3. Further, the active layer 4 further includes a third silicon layer 43 composed of a doped amorphous silicon material (i.e. n+a-Si), and the third silicon layer 43 is formed on the second silicon layer 42. Specifically, the third silicon layer 43 is formed on a surface of the second silicon layer 42 facing away from the gate insulating layer 3. The third silicon layer 43 n+a-Si acts to form an ohmic contact with the metal, such that the voltage drop across the TFT device is not above the contact surface of the metal and the semiconductor. The active layer 4 composed of three silicon layers is more advantageous for increasing electron mobility.

Further, in the array substrate provided by an embodiment of the present application, the array substrate further includes an etching barrier layer 9, and the etching barrier layer 9 is formed on the first silicon layer 41 composed of polycrystalline silicon 411. Specifically, the etching barrier layer 9 is disposed on a surface of the first silicon layer 41 facing away from the gate insulating layer 3. During the preparation process, the etching barrier layer 9 may ensure that the characteristics of the upper and lower sides of the first silicon layer 41 are not affected by other processes, and stabilize the characteristics of the active layer 4 composed of the first silicon layer 41 and the TFT device. The etching barrier layer 9 may be selected from insulating materials such as SiNx, SiOx or the like.

Further, in the array substrate provided by an embodiment of the present application, the material of the gate electrode 2 may be a metal or an alloy such as copper, aluminum, molybdenum or the like; the material of the gate insulating layer 3 may be a material such as SiNx, SiOx or the like; and the material of the source-drain electrode 5 is a metal or an alloy such as copper, aluminum, molybdenum or the like. The source-drain electrode 5 is provided with a channel above the active layer 4, and the source-drain electrodesource-drain electrode 5 is divided into a source electrode and a drain electrode, and the source electrode and the drain electrode are distributed on both sides of the active layer 4, respectively. Alternatively, the active layer 4 may completely cover the gate insulating layer 3 (as shown in FIG. 1), or the active layer 4 may cover only the gate insulating layer 3 above the gate electrode 2 (as shown in FIG. 2). The material of the passivation layer 6 is a material such as SiNx, SiOx or the like, and the pixel electrode 7 may be made of ITO (Indium Tin Oxide). The polycrystalline silicon may be selected as low temperature polycrystalline silicon (LTP 5).

Figure 3:
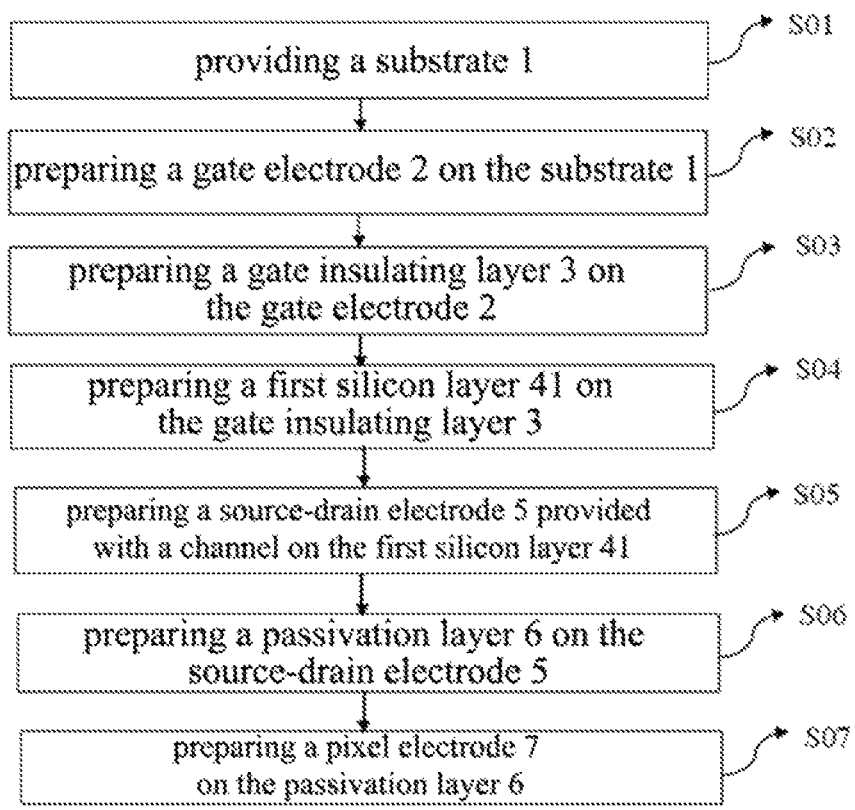
FIG. 3 is a process flow chart of a method for fabricating the array substrate of the present application.

In another aspect, the present application provides a method for fabricating an array substrate, as shown in FIG. 3, and the method includes:

S01: providing a substrate 1;

S02: preparing a gate electrode 2 on the substrate 1;

S03: preparing a gate insulating layer 3 on the gate electrode 2;

S04: preparing a first silicon layer 41 on the gate insulating layer 3;

S05: preparing a source-drain electrode 5 on the first silicon layer 41, wherein the source-drain electrode 5 is provided with a channel;

S06: preparing a passivation layer 6 on the source-drain electrode 5; and S07: preparing a pixel electrode 7 on the passivation layer 6;

wherein, the first silicon layer 41 forms the active layer 4, and the first silicon layer 41 disposed below the channel is composed of polycrystalline silicon 411, and the remaining part of the first silicon layer 41 is composed of amorphous silicon 412.

The method for fabricating the array substrate provided in the embodiment of the present application, fabricates the first silicon layer 41 composed of both the polycrystalline silicon 411 and the amorphous silicon 412 as the active layer 4. This fabrication method has both advantages of simple processes of the conventional a-Si and the high mobility of the polycrystalline silicon, which has strong operability in large generation lines, and the overall electron mobility of the active layer 4 of the array substrate finally fabricated is higher than the electron mobility of the current array substrate.

Further, the step of preparing a first silicon layer on the gate insulating layer includes:

S041: depositing an amorphous silicon material layer on the gate insulating layer 3;

S042: covering a laser mask on the amorphous silicon material layer, and performing laser annealing by a laser beam, such that the exposed amorphous silicon under the channel is converted into polycrystalline silicon so as to obtain the first silicon layer 41.

Figure 4:
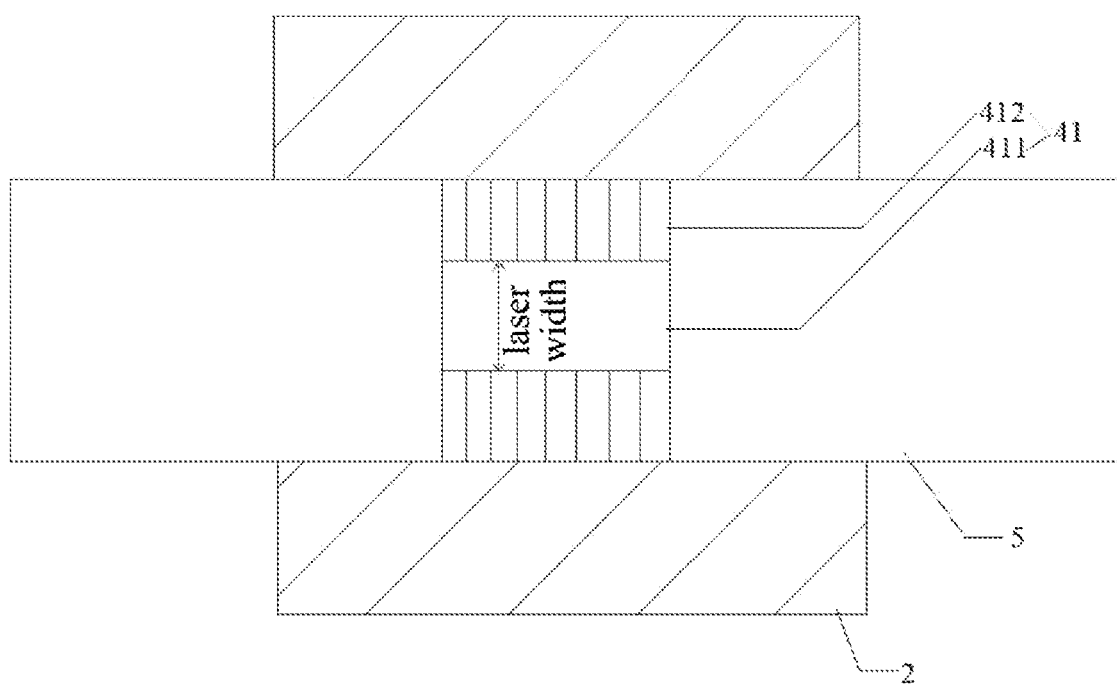
FIG. 4 is a schematic view of converting the amorphous silicon into the polycrystalline silicon when fabricating the first silicon layer in a method for fabricating the array substrate of the present application.

The schematic view of the preparation of the first silicon layer is as shown in FIG. 4, when the first silicon layer 41 of the embodiment of the present application is prepared, the laser width may be controlled by the laser mask, and the laser width region is the LTPS region, and different electron mobilities may be achieved through different laser widths. A larger laser width allows for a greater electron mobility, and a smaller width allows for a smaller Ioff (off-state current). Alternatively, the laser width is between 2 µm and 20 µm. The LTPS with large area is affected by the problem of uniformity, so it is not suitable for large-area production, and the leakage current of the LTPS is large, which affects the quality such as image sticking of the panel, etc. In the embodiment of the present application, this defect can be overcome. In the embodiment of the present application, the laser width is controlled by controlling the laser mask, so as to prepare the first silicon layer 41 having polycrystalline silicon at the channel and amorphous silicon at the remaining portion.

Further, the annealing energy for the laser annealing treatment is 200-450 mJ/cm$^2$. Further, the laser annealing treatment is excimer laser annealing and/or Yttrium Aluminum Garnet (YAG) laser beam annealing. The level of annealing energy determines the change process of the a-Si into the crystalline silicon, and different electron mobilities may be achieved by controlling the annealing energy.

The electron mobility of the a-si is 0.3-1 cm$^2$/Vs; the electron mobility of the LTPS is about 100 cm$^2$/Vs (takes the range 50-200 cm$^2$/Vs), and the overall electron mobility of the active layer with the channel formed in the embodiment of the present application is 5-150 cm$^2$/Vs.

In summary, the annealing energy and the laser width of the laser beam can affect the overall electron mobility, and the TFT having a suitable mobility and a low Ioff may be obtained by modulating the annealing energy and the laser width of the laser beam.

Further, the fabricating method provided by an embodiment of the present application further includes depositing a etching barrier layer 9 under the channel. Specifically, the etching barrier layer 9 is deposited after the step of depositing an amorphous silicon material layer on the gate insulating layer 3. During the preparation process, the etching barrier layer 9 may ensure that the characteristics of the upper and lower sides of the first silicon layer 41 are not affected by other processes, and stabilize the characteristics of the active layer 4 and the TFT device. The etching barrier layer may be selected from insulating materials such as SiNx, SiOx or the like.

Further, a second silicon layer 42 composed of an amorphous silicon material may be deposited on the first silicon layer 41, and a third silicon layer 43 composed of a heavily doped amorphous silicon material (i.e., n+a Si) may be deposited on the second silicon layer 42. The active layer 4 composed of the three silicon layers is more advantageous for increasing the electron mobility.

At last, the present application further provides a display for a Micro LCD, which includes an array substrate, and the array substrate includes:

a substrate 1;

a gate electrode 2 formed on the substrate 1;

a gate insulating layer 3 formed on the substrate 1 and covering the gate electrode 2;

an active layer 4 formed on the gate insulating layer 3;

a source-drain electrode 5 formed on the gate insulating layer 3 and covering the active layer 4, wherein the source-drain electrode 5 is provided with a channel, and the channel is disposed above the active layer 4;

a passivation layer 6 formed on the source-drain electrode 5;

a pixel electrode 7 formed on the passivation layer 6;

wherein, the active layer 4 includes a first silicon layer 41 formed on the gate insulating layer 3, and the first silicon layer 41 disposed below the channel is composed of polycrystalline silicon 411, and the remaining part of the first silicon layer 41 is composed of amorphous silicon 412; the active layer 4 further includes a second silicon layer 42 composed of an amorphous silicon material and formed on the first silicon layer 41, and a third silicon layer 43 composed of a doped amorphous silicon material and formed on the second silicon layer 42; and an etching barrier layer 9 formed on the first silicon layer 41 composed of polycrystalline silicon.

The display of the embodiment of the present application includes the array substrate unique in the embodiment of the present application, and in the array substrate, the first silicon layer composed of polycrystalline silicon and amorphous silicon, the second silicon layer composed of the amorphous silicon material and the third silicon layer composed of the doped amorphous silicon material serve as the active layer, which has both a conventional TFT structure of the amorphous silicon and a high electron mobility characteristic of the polycrystalline silicon. Such a display has a better light-emitting effect.

Further, the display is a Micro LED display, wherein the array substrate is provided with a Micro LED 8.

In the Micro LED of the embodiment of the present application, the luminescent material may include a luminescence compound or elemental material containing gallium (Ga), arsenic (As), phosphorus (P) or nitrogen (N), such as aluminum gallium arsenide, gallium arsenide, gallium arsenide phosphide, indium gallium phosphide, aluminum gallium phosphide (doped zinc oxide), aluminum gallium phosphide, indium gallium nitride/gallium nitride, gallium phosphide, indium gallium aluminum phosphide, aluminum gallium phosphide, aluminum indium phosphide, gallium arsenide, indium gallium phosphide, gallium phosphide, phosphorus arsenic gallium, gallium phosphide, zinc selenide, indium gallium nitride, silicon carbide, gallium nitride (GaN), indium gallium nitride, silicon carbide, sapphire, zinc selenide, diamond, aluminum nitride, aluminum gallium nitride or the like.

The present application has been tested several times in succession, and a part of the test results are now described in further detail as a reference, which will be described in detail below in conjunction with specific embodiments.

In one embodiment

A Micro LCD display, which is as shown in FIG. 1, and includes an array substrate and a Micro LED 8 disposed on the array substrate. The array substrate includes: a substrate 1 made of glass; a gate electrode 2 formed on the substrate 1; a gate insulating layer 3 formed on the substrate 1 and covering the gate electrode 2; an active layer 4 formed on the gate insulating layer 3; a source-drain electrode 5 formed on the gate insulating layer 3 and covering the active layer 4, wherein the source-drain electrode 5 is provided with a channel, and the channel is disposed above the active layer 4; a passivation layer 6 formed on the source-drain electrode 5; a pixel electrode 7 formed on the passivation layer 6; wherein, the active layer 4 includes a first silicon layer 41, a second silicon layer 42 and a third silicon layer 43 disposed from bottom to top, and the first silicon layer 41 disposed below the channel is composed of polycrystalline silicon 411, and the remaining part of the first silicon layer 41 is composed of amorphous silicon 412, and the first silicon layer 41 composed of polycrystalline silicon is provide with an etching barrier layer 9.

The method for fabricating the Micro LCD display includes the following steps of:

1. providing a substrate 1 (glass substrate);
2. performing depositing, exposure, development and etching for a gate electrode 2 (gate) on the substrate;
3. depositing a gate insulating layer 3 (GI-SiNx) on the gate electrode 2;
4. depositing a layer of amorphous silicon material (1$^{st}$ a-Si) on the gate insulating layer 3, and depositing an etching barrier layer 9 (SiO$_2$);
5. performing laser annealing for the amorphous silicon material at the channel through a Micro Lens laser beam to form a polycrystalline silicon material, so as to obtain a first silicon layer 41;
6. performing exposure, development and etching for the etching barrier layer 9;
7. depositing a second silicon layer 42 (2$^{nd}$ a-Si) and a third silicon layer 43 (n+a-Si) through chemical vapor deposition (CVD), and then depositing a source-drain electrode 5 (Source-Drain, SD);
8. performing exposure, development, etching and n+ etching for the source-drain electrode 5;
9. performing depositing, exposure, development and etching for a passivation layer 9 (passivation);
10. performing depositing, exposure, development and etching for a pixel electrode 7 (ITO); and
11. preparing the PN junction of the Micro LED 8.

In another embodiment

A Micro LCD display, which is as shown in FIG. 2, and includes an array substrate and a Micro LED 8 disposed on the array substrate. The array substrate includes: a substrate 1 made of glass; a gate electrode 2 formed on the substrate 1; a gate insulating layer 3 formed on the substrate 1 and covering the gate electrode 2; an active layer 4 formed on the gate insulating layer 3; a source-drain electrode 5 formed on the gate insulating layer 3 and covering the active layer 4, wherein the source-drain electrode 5 is provided with a channel, and the channel is disposed above the active layer 4; a passivation layer 6 formed on the source-drain electrode 5; a pixel electrode 7 formed on the passivation layer 6; wherein, the active layer 4 includes a first silicon layer 41, a second silicon layer 42 and a third silicon layer 43 disposed from bottom to top, and the first silicon layer 41 disposed below the channel is composed of polycrystalline silicon 411, and the remaining part of the first silicon layer 41 is composed of amorphous silicon 412.

The method for fabricating the Micro LCD display includes the following steps of:

1. providing a substrate 1 (glass substrate);
2. performing depositing, exposure, development and etching for a gate electrode 2 (gate) on the substrate;
3. depositing a gate insulating layer 3 (GI-SiNx) on the gate electrode 2 through CAD;
4. depositing a layer of amorphous silicon material (1$^{st}$ a-Si) on the gate insulating layer 3 through CVD;
5. performing laser annealing for the amorphous silicon material at the channel through a Micro Lens laser beam to form a polycrystalline silicon material, so as to obtain a first silicon layer 41;
6. depositing a second silicon layer 42 (2$^{nd}$ a-Si) and a third silicon layer 43 (n+a-Si) through CVD, and then depositing a source-drain electrode 5 (Source-Drain, SD);
7. performing exposure, development, etching and n+ etching for the source-drain electrode 5;
8. performing depositing, exposure, development and etching for a passivation layer 9 (passivation);
9. performing depositing, exposure, development and etching for a pixel electrode 7 (ITO); and
10. preparing the PN junction of the Micro LED 8.

The above description is merely alternative embodiments of the present application, and is not intended to limit the present application. Various changes and modifications may be made to the present application. Any modifications, equivalent substitutions and improvements made within the spirit and principles of the present application are intended to be included within the scope of the present application.

What is claimed is:

1. An array substrate, comprising:
   a substrate;
   a gate electrode formed on the substrate;
   a gate insulating layer formed on the substrate and covering the gate electrode;
   an active layer formed on the gate insulating layer;
   a source-drain electrode formed on the gate insulating layer and covering the active layer, wherein the source-drain electrode is provided with a channel, and the channel is disposed above the active layer;
   a passivation layer formed on the source-drain electrode; and
   a pixel electrode formed on the passivation layer;
   wherein, the active layer includes a first silicon layer formed on the gate insulating layer, and the first silicon layer disposed below the channel is composed of polycrystalline silicon, and the remaining part of the first silicon layer is composed of amorphous silicon; and
   an etching barrier layer formed on the first silicon layer composed of polycrystalline silicon.

2. The array substrate according to claim 1, wherein the active layer further comprises a second silicon layer composed of an amorphous silicon material, and the second silicon layer is formed on the first silicon layer.

3. The array substrate according to claim 2, wherein the active layer further comprises a third silicon layer composed of a doped amorphous silicon material, and the third silicon layer is formed on the second silicon layer.

4. A method for fabricating an array substrate, comprising the following steps of:
   providing a substrate;
   preparing a gate electrode on the substrate;
   preparing a gate insulating layer on the gate electrode;
   preparing a first silicon layer on the gate insulating layer;
   preparing a source-drain electrode on the first silicon layer, wherein the source-drain electrode is provided with a channel;
   preparing a passivation layer on the source-drain electrode; and
   preparing a pixel electrode on the passivation layer;
   wherein, the first silicon layer forms an active layer, and the first silicon layer disposed below the channel is composed of polycrystalline silicon, and the remaining part of the first silicon layer is composed of amorphous silicon; and
   the method further comprises preparing an etching barrier layer formed on the first silicon layer composed of polycrystalline silicon.

5. The method according to claim 4, wherein the step of preparing a first silicon layer on the gate insulating layer comprises:
depositing an amorphous silicon material layer on the gate insulating layer; and
covering a laser mask on the amorphous silicon material layer, and performing laser annealing by a laser beam, such that the exposed amorphous silicon under the channel is converted into polycrystalline silicon so as to obtain the first silicon layer.

6. The method according to claim 5, wherein the annealing energy for the laser annealing is 200-450 mJ/cm$^2$.

7. The method according to claim 5, wherein the laser annealing is excimer laser annealing.

8. The method according to claim 5, wherein the laser annealing is Yttrium aluminum garnet laser beam annealing.

9. The method according to claim 5, wherein the etching barrier layer is under the channel.

10. A display, comprising an array substrate, and the array substrate comprises:
a substrate;
a gate electrode formed on the substrate;
a gate insulating layer formed on the substrate and covering the gate electrode;
an active layer formed on the gate insulating layer;
a source-drain electrode formed on the gate insulating layer and covering the active layer, wherein the source-drain electrode is provided with a channel, and the channel is disposed above the active layer;
a passivation layer formed on the source-drain electrode; and
a pixel electrode formed on the passivation layer;
wherein, the active layer includes a first silicon layer formed on the gate insulating layer, and the first silicon layer disposed below the channel is composed of polycrystalline silicon, and the remaining part of the first silicon layer is composed of amorphous silicon; the active layer further includes a second silicon layer composed of an amorphous silicon material and formed on the first silicon layer, and a third silicon layer composed of a doped amorphous silicon material and formed on the second silicon layer; and
an etching barrier layer formed on the first silicon layer composed of polycrystalline silicon.

11. The display according to claim 10, wherein the display is a Micro LCD display.

* * * * *